(12) United States Patent
Furuya et al.

(10) Patent No.: US 10,332,937 B2
(45) Date of Patent: Jun. 25, 2019

(54) SEMICONDUCTOR DEVICE HAVING A PROTRUDING INTERPOSER EDGE FACE

(71) Applicant: SUMITOMO ELECTRIC INDUSTRIES, LTD., Osaka (JP)

(72) Inventors: Akira Furuya, Yokohama (JP); Koichi Koyama, Yokohama (JP); Mitsuharu Hirano, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/824,858

(22) Filed: Nov. 28, 2017

(65) Prior Publication Data

US 2018/0175113 A1    Jun. 21, 2018

(30) Foreign Application Priority Data

Dec. 16, 2016  (JP) .................. 2016-244707

(51) Int. Cl.
*H01L 23/49* (2006.01)
*H01L 27/30* (2006.01)
(Continued)

(52) U.S. Cl.
CPC .............. *H01L 27/304* (2013.01); *G02B 6/30* (2013.01); *H01L 21/486* (2013.01);
(Continued)

(58) Field of Classification Search
CPC ........... H01L 23/49827; H01L 23/5384; H01L 27/304
See application file for complete search history.

(56) References Cited

U.S. PATENT DOCUMENTS 7,291,869 B2 * 11/2007 Otremba ........... H01L 23/49575
257/107
8,154,134 B2 *  4/2012 Bonifield .............. H01L 23/481
257/676
(Continued)

FOREIGN PATENT DOCUMENTS

JP         04-308804        10/1992
JP       2008-091522         4/2008
(Continued)

*Primary Examiner* — Ida M Soward
(74) *Attorney, Agent, or Firm* — Smith, Gambrell & Russell, LLP.

(57) ABSTRACT

A semiconductor device includes: a printed substrate having a through hole from an upper face to a lower face thereof; a first semiconductor element mounted on the printed substrate; an interposer mounted on the upper face of the printed substrate; a second semiconductor element adjacent to the interposer and arranged to overlap with the through hole; and a bonding wire coupling a first pad to a second pad, the first pad being on an upper face of the interposer and being positioned on the second semiconductor element side, the second pad being on an upper face of the second semiconductor element and being positioned on the interposer side, wherein the interposer has an edge face protruding with respect to a wall face of the through hole of the printed substrate toward the second semiconductor element, and the edge face faces with an edge face of the second semiconductor element.

10 Claims, 14 Drawing Sheets

(51) Int. Cl.

| | | |
|---|---|---|
| *H01L 21/48* | (2006.01) | |
| *H01L 21/67* | (2006.01) | |
| *G02B 6/30* | (2006.01) | |
| *H01L 23/367* | (2006.01) | |
| *H01L 23/48* | (2006.01) | |
| *H01L 25/065* | (2006.01) | |
| *H01L 25/00* | (2006.01) | |
| *H01L 23/13* | (2006.01) | |
| *H01L 23/538* | (2006.01) | |
| *H01L 23/00* | (2006.01) | |
| *H01L 23/498* | (2006.01) | |

(52) U.S. Cl.
CPC ........ *H01L 21/67236* (2013.01); *H01L 23/13* (2013.01); *H01L 23/367* (2013.01); *H01L 23/48* (2013.01); *H01L 25/0655* (2013.01); *H01L 25/50* (2013.01); *H01L 23/3677* (2013.01); *H01L 23/49827* (2013.01); *H01L 23/5384* (2013.01); *H01L 24/05* (2013.01); *H01L 24/13* (2013.01); *H01L 24/16* (2013.01); *H01L 24/29* (2013.01); *H01L 24/32* (2013.01); *H01L 24/45* (2013.01); *H01L 24/48* (2013.01); *H01L 24/49* (2013.01); *H01L 24/81* (2013.01); *H01L 24/85* (2013.01); *H01L 2224/05553* (2013.01); *H01L 2224/05624* (2013.01); *H01L 2224/10* (2013.01); *H01L 2224/13101* (2013.01); *H01L 2224/16225* (2013.01); *H01L 2224/29339* (2013.01); *H01L 2224/32245* (2013.01); *H01L 2224/42* (2013.01); *H01L 2224/45124* (2013.01); *H01L 2224/45144* (2013.01); *H01L 2224/48011* (2013.01); *H01L 2224/48091* (2013.01); *H01L 2224/49175* (2013.01); *H01L 2224/73265* (2013.01); *H01L 2924/15151* (2013.01); *H01L 2924/15311* (2013.01)

(56) References Cited

U.S. PATENT DOCUMENTS

| | | | | |
|---|---|---|---|---|
| 8,669,656 | B2* | 3/2014 | Slupsky | G08C 17/04 257/723 |
| 9,236,350 | B2* | 1/2016 | Sutardja | H01L 23/13 |
| 10,032,705 | B2* | 7/2018 | Lee | H01L 23/49838 |
| 2012/0162928 | A1* | 6/2012 | Das | H05K 7/00 361/728 |
| 2012/0175732 | A1* | 7/2012 | Lin | H01L 23/49816 257/531 |
| 2014/0251658 | A1* | 9/2014 | Lin | H05K 1/0206 174/252 |
| 2016/0035909 | A1* | 2/2016 | Ehrenpfordt | H01L 31/02008 136/256 |
| 2016/0291253 | A1 | 10/2016 | Furuya et al. | |
| 2017/0062383 | A1* | 3/2017 | Yee | H01L 25/0652 |
| 2017/0227723 | A1 | 8/2017 | Murakami et al. | |
| 2018/0012857 | A1* | 1/2018 | Lin | H01L 21/561 |
| 2018/0158768 | A1* | 6/2018 | Kim | H01L 21/561 |
| 2018/0166373 | A1* | 6/2018 | Lin | H05K 1/0204 |

FOREIGN PATENT DOCUMENTS

| | | |
|---|---|---|
| JP | 2016-194658 | 11/2016 |
| JP | 2017-142325 | 8/2017 |

* cited by examiner

SEMICONDUCTOR DEVICE HAVING A PROTRUDING INTERPOSER EDGE FACE

CROSS-REFERENCE TO RELATED APPLICATION

This application is based upon and claims the benefit of priority of the prior Japanese Patent Application No. 2016-244707, filed on Dec. 16, 2016, the entire contents of which are incorporated herein by reference.

BACKGROUND

(i) Technical Field

The present invention relates to a semiconductor device and a manufacturing method of a semiconductor device.

(ii) Related Art

There is known a technology in which an electronic component is mounted on a printed substrate (for example, see Japanese Patent Application Publication No. 2008-91522).

SUMMARY

An electronic component such as a semiconductor chip is mounted on a printed substrate, and the electronic component is electrically coupled with the printed substrate via bonding wire. When the bonding wire is long, an electrical signal may be degraded because of influence of inductance of the bonding wire. In particular, when a rate of an electrical signal transmitted in the bonding wire is high, the electrical signal may be greatly degraded.

According to an aspect of the present invention, there is provided a semiconductor device including: a printed substrate in which a through hole is formed from an upper face thereof to a lower face thereof; a first semiconductor element that is mounted on the printed substrate and is electrically coupled to the printed substrate; an interposer that is mounted on the upper face of the printed substrate and is electrically coupled to the first semiconductor element; a second semiconductor element that is adjacent to the interposer and is arranged so as to overlap with the through hole; and a bonding wire that couples a first pad to a second pad, the first pad being on an upper face of the interposer and being positioned on the second semiconductor element side, the second pad being on an upper face of the second semiconductor element and being positioned on the interposer side, wherein the interposer has an edge face protruding with respect to a wall face of the through hole of the printed substrate toward the second semiconductor element, and the edge face faces with an edge face of the second semiconductor element.

DETAILED DESCRIPTION

Figure 1:
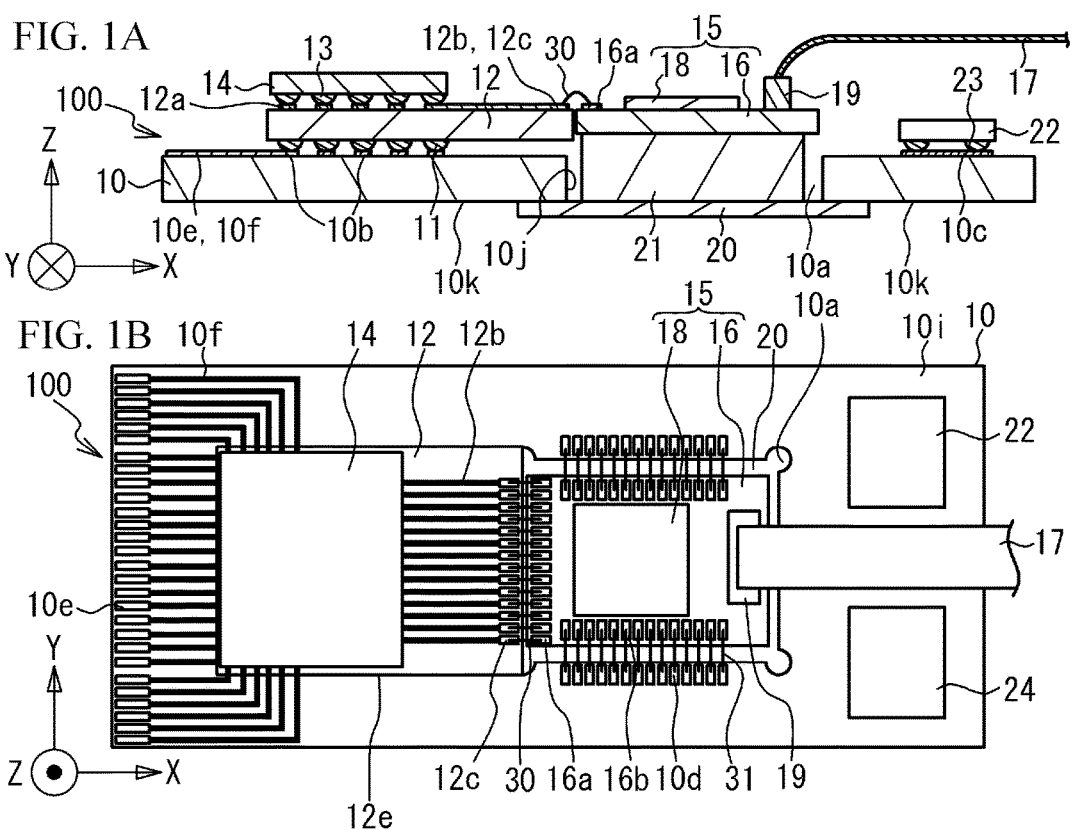
FIG. 1A illustrates a cross sectional view of a semiconductor device in accordance with a first embodiment.
FIG. 1B illustrates a plane view of a semiconductor device.

Description of Embodiments of the Present Invention

First of all, the contents of embodiments of the present invention will be listed and described.

The present invention is a semiconductor device including: a printed substrate in which a through hole is formed from an upper face thereof to a lower face thereof; a first semiconductor element that is mounted on the printed substrate and is electrically coupled to the printed substrate; an interposer that is mounted on the upper face of the printed substrate and is electrically coupled to the first semiconductor element; a second semiconductor element that is adjacent to the interposer and is arranged so as to overlap with the through hole; and a bonding wire that couples a first pad to a second pad, the first pad being on an upper face of the interposer and being positioned on the second semiconductor element side, the second pad being on an upper face of the second semiconductor element and being positioned on the interposer side, wherein the interposer has an edge face protruding with respect to a wall face of the through hole of the printed substrate toward the second semiconductor element, and the edge face faces with an edge face of the second semiconductor element.

The printed substrate may be made of resin; and the interposer may be made of ceramic.

A rate of an electrical signal transmitted in the bonding wire may be higher than that of an electrical signal transmitted between the first semiconductor element and the printed substrate.

The first semiconductor element may perform at least one of increasing a rate of an electrical signal input from the printed substrate and decreasing a rate of an electrical signal input from the interposer.

An upper face of the first pad of the interposer may be positioned at a same height as an upper face of the second pad of the second semiconductor element.

The interposer and the first semiconductor element may be surface-mounted on the upper face of the printed substrate.

The interposer may be surface-mounted on the upper face of the printed substrate; and the first semiconductor element may be surface-mounted on the upper face of the interposer.

The semiconductor device may further include a metallic base member that is provided inside of the through hole. The second semiconductor element may be provided on an upper face of the base member.

The semiconductor device may further include an optical fiber that extends from the upper face of the second semiconductor element or a side face of the second semiconductor element. The second semiconductor element may perform at least one of converting an electrical signal input from the interposer into an optical signal and outputting the optical signal to the optical fiber, and converting an optical signal input from the optical fiber into an electrical signal.

The present invention is a manufacturing method of a semiconductor device including: preparing a printed substrate in which a through hole is formed from an upper face thereof to a lower face thereof; mounting a first semiconductor element on an upper face of an interposer so that the first semiconductor element is electrically coupled to the interposer; mounting the interposer on an upper face of the printed substrate so that the interposer is electrically coupled to the printed substrate; arranging a second semiconductor element so that the second semiconductor element is adjacent to the interposer and overlaps with the through hole; and electrically coupling a first pad to a second pad, the first pad being on an upper face of the interposer and being positioned on the second semiconductor element side, the second pad being on an upper face of the second semiconductor element and being positioned on the interposer side, wherein an edge face of the interposer protrudes toward the second semiconductor element with respect to a wall face of the through hole of the printed substrate and faces with an edge face of the second semiconductor element.

Details of Embodiments of the Present Invention

A description will be given embodiments of semiconductor devices of embodiments of the present invention, with drawings. The present invention is not limited to the specifically disclosed embodiments and variations but may include other embodiments and variations without departing from the scope of the present invention.

First Embodiment

FIG. 1A illustrates a cross sectional view of a semiconductor device 100 in accordance with a first embodiment. FIG. 1B illustrates a plane view of the semiconductor device 100. An X-direction is a direction on which an interposer 12 and a semiconductor chip 16 are arrayed. A Y-direction is a direction on which semiconductor components 22 and 24 are arrayed. A Z-direction is a direction perpendicular to the X-direction and the Y-direction.

As illustrated in FIG. 1A and FIG. 1B, the semiconductor device 100 has a printed substrate 10, the interposer 12, semiconductor components 14, 22 and 24, the semiconductor chip 16, a semiconductor chip 18, a metal board 20 and a base member 21. The interposer 12 and the semiconductor components 22 and 24 are surface-mounted on an upper face 10i of the printed substrate 10. The semiconductor component 14 is surface-mounted on an upper face of the interposer 12. The printed substrate 10 has a through hole 10a from the upper face 10i of the printed substrate 10 to a lower face 10k of the printed substrate 10. The metal board 20 is provided on the lower face 10k of the printed board 10 and covers the through hole 10a. The base member 21 is provided in the through hole 10a and on an upper face of the metal board 20. The bare semiconductor chip 16 is mounted on an upper face of the base member 21. The bare semiconductor chip 18 is flip-chip mounted on the upper face of the semiconductor chip 16. The semiconductor chip 16 and the semiconductor chip 18 structure a semiconductor element 15.

The printed substrate 10 is, for example, a laminated substrate in which a plurality of glass epoxy resin layers (insulating layers) are adhered with a prepreg. A conductive layer is provided between the plurality of insulating layers. The conductive layers are electrically coupled with each other via a via wiring penetrating the insulating layer. A thickness of the printed substrate 10 is, for example, 2 mm. A plurality of pads 10b to 10e and a wiring pattern 10f are provided on the upper face of the printed substrate 10. The upper face of the printed substrate extends in XY-plane. The through hole 10a extends in the Z-direction (up and down direction of FIG. 1A) and penetrates the printed substrate 10.

The interposer 12 is a laminated substrate formed with ceramics such as alumina ($Al_2O_3$) or the like. A thickness of the interposer 12 is, for example, 1 mm. Each conductive layer is provided between ceramic layers. The conductive layers are coupled via a via wiring. The interposer 12 is electrically coupled with the pad 10b of the printed substrate 10 via a solder ball 11 provided on the lower face of the interposer 12. An edge face 12d (side face of +X side) of the interposer 12 protrudes toward the semiconductor chip 16 side with respect to a side wall 10j of the through hole 10a. The edge face 124 of the interposer 12 faces with an edge face 16c (side face of −X side) of the semiconductor chip 16. A plurality of pads 12a, a plurality of pads 12c and a plurality of wiring patterns 12b are provided on the upper face of the interposer 12. The pads 12c (a first pad) are provided on the upper face of the interposer 12 and positioned on the semiconductor chip 16 side. The pads 12c are arrayed along the edge face 12d. The wiring pattern 12b electrically couples pad 12a with pad 12c.

In the semiconductor component 14 (a first semiconductor element), an integrated circuit (IC) such as SERDES-IC (SERializer/DESerializer-IC) is housed in a package having a ball grid array (BGA). The semiconductor component 14 is electrically coupled with the pad 12a of the interposer 12 via a solder ball 13.

An electrical signal is input into the pad 10e of the printed substrate 10 from an external electronic device. Moreover, the electrical signal is input into the semiconductor component 14 via the interposer 12. The semiconductor component 14 increases the rate of the electrical signal and outputs the electrical signal to the wiring pattern 12b of the interposer 12. The semiconductor component 14 decreases the rate of the electrical signal input from the wiring pattern 12b of the interposer 12 and outputs the electrical signal to the pad 10b of the printed substrate 10 via the pad 12a of the interposer 12 and the solder ball 11. For example, the semiconductor component 14 converts two electrical signals of 25 Gbaud input from the printed substrate 10 into an electrical signal of 50 Gbaud and outputs the converted electrical signal to the wiring pattern 12b of the interposer 12. The semiconductor component 14 divides an electrical signal of 50 Gbaud input from the wiring pattern 12b of the interposer 12 into two electrical signals of 25 Gbaud, and outputs the two electrical signals to the pad 10b of the printed substrate 10. In an optical communication, an electrical signal with a high rate of 50 Gbaud or more may be used. The semiconductor component 14 may convert ten electrical signals of 10 Gbaud into four electrical signals of 25 Gbaud or may convert four electrical signals of 25 Gbaud into ten electrical signals of 10 Gbaud. The electrical signal of 10 Gbaud has a signal frame of 10G per one second. 10 Gbaud corresponds to a signal rate of 10 Gbps in a NRZ type and a signal rate of 20 Gbps of PAM4 type (4-value pulse-amplitude modulation).

The semiconductor element 15 is, for example, a Si Photonics-IC (optical integrated circuit) or the like and includes the semiconductor chips 16 and 18. The semiconductor element 15 overlaps with the through hole 10a in the extension direction of the through hole 10a (Z-direction). That is, the semiconductor element 15 is inside of the through hole 10a in a planer view. The semiconductor element 15 is smaller than the through hole 10a in the planer view. The semiconductor element 15 converts an electrical signal input from the interposer 12 into a modulated optical signal and outputs the optical signal to an optical fiber 17. The semiconductor element 15 converts the modulated optical signal input from the optical fiber 17 into an electrical signal and outputs the electrical signal to the interposer 12.

The semiconductor chip 16 (a second semiconductor element) is, for example, a photo IC (PIC) in which a plurality of Mach-Zehnder modulators and a germanium (Ge) photo detector are provided on a SOI (Silicon on Insulator) substrate. The semiconductor chip 16 inputs an optical signal and outputs an optical signal. The semiconductor chip 16 is mounted on the upper face of the base member 21 via a silver (Ag) paste or the like. The upper face of the semiconductor chip 16 is positioned at the same height as the upper face of the interposer 12. A plurality of pads 16a and a plurality of pads 16b are provided on the upper face of the semiconductor chip 16. The plurality of pads 16a (second pads) are positioned on the interposer 12 side and are electrically coupled to the pads 12c of the interposer 12 via a bonding wire 30. The pads 16a are arrayed along the edge face 16c. The plurality of pads 16b are electrically coupled to the pads 10d of the printed substrate 10 via bonding wires 31.

The semiconductor chip 18 is flip-chip mounted on the upper face of the semiconductor chip 16 and is electrically coupled to the semiconductor chip 16. The semiconductor chip 18 is, for example, an electronic integrated circuit (EIC) including a driver for a Mach-Zehnder modulator, and a trans impedance amplifier (TIA).

The pads and the wiring patterns are made of a metal such as aluminum (Al). The bonding wires are made of a metal such as gold (Au) or aluminum (Al).

The metal board 20 and the base member 21 are made of a metal such as copper (Cu). The metal board 20, the base member 21 and the semiconductor chip 16 are bonded with each other through an adhesive agent such as an Ag paste of which conductivity is high. Heat generated in the semiconductor element 15 is released through the base member 21 and the metal board 20.

The optical fiber 17 is inserted in a holder 19 and is supported by the holder 19. The optical fiber 17 is coupled to the upper face of the semiconductor chip 16 and extends in an upward direction and a horizontal direction (Z-direction and X-direction). The optical fiber 17 is optically coupled to the semiconductor chip 16. An optical signal output from the semiconductor chip 16 is output to an external device via the optical fiber 17. The optical signal is input to the semiconductor chip 16 via the optical fiber 17. The number of the optical fiber 17 is determined in accordance with the number of channels of an optical input or an optical output of the semiconductor chip 16. Therefore, the number of the optical fiber 17 may be one or more.

The semiconductor components 22 and 24 mounted on the upper face of the printed substrate 10 are components in which an IC for a power supply regulator or a CPU for controlling a circuit are housed in a package. A chip component such as a resistor or a capacitor may be mounted on the printed substrate.

Figure 2:
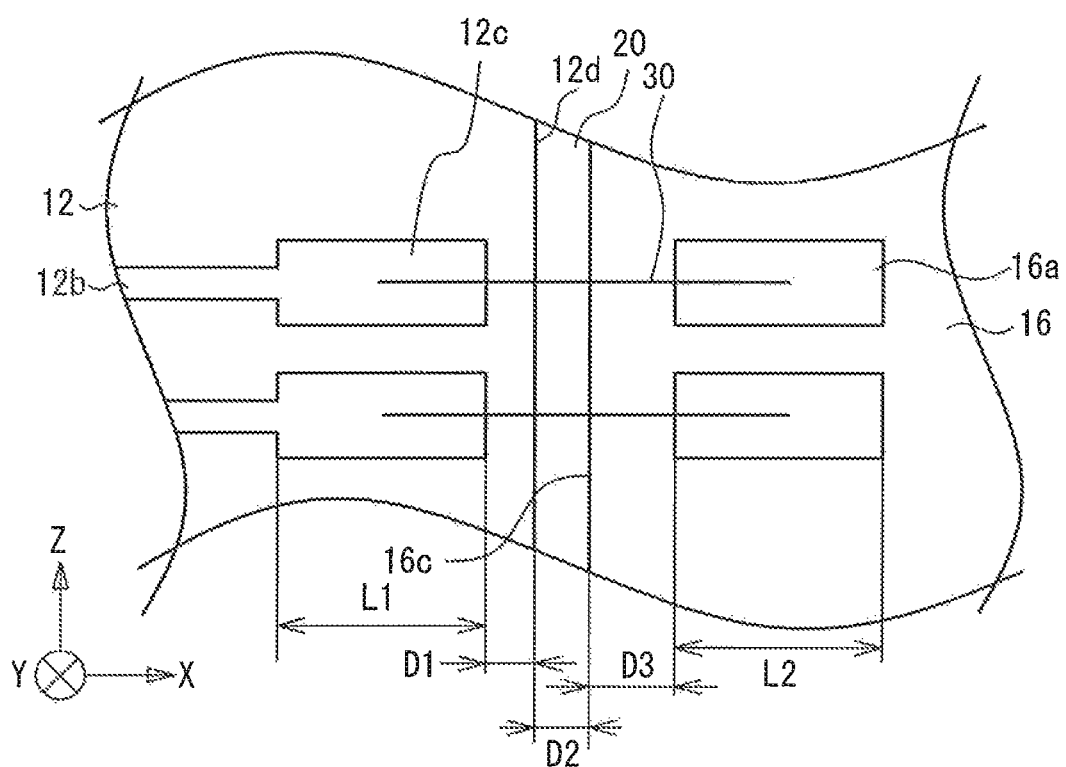
FIG. 2 illustrates an enlarged view of pads.

FIG. 2 illustrates an enlarged view of the pads 12c and the pads 16a. As illustrated in FIG. 2, the pads 12c and the pads 16a have a rectangular shape or the like. A length L1 of a side of the pad 12c and a length L2 of a side of the pad 16a in the X-direction are 75 μm. A distance D1 from an edge of the pad 12c to an edge face of the interposer 12 is, for example, 50±50 μm. The distance D1 is determined in accordance with processing accuracy of the interposer 12. The processing accuracy of the interposer 12 is improved when the interposer 12 is formed by a dicing process or the like. And a tolerance of the distance D1 is approximately ±50 μm. A distance D2 from the edge face of the interposer 12 to the edge face of the semiconductor chip 16 is, for example, 0 to 20 μm. However, when the semiconductor device 100 is used in an circumference in which a temperature greatly changes, the distance D2 may be a value larger than 0 μm. For example, the distance D2 may be 10 μm or more and 20 μm or less. In the circumference of at a high temperature, the interposer 12 and the semiconductor chip 16 thermally expand. When the distance D2 is 0 μm and the edge faces of the interposer 12 and the semiconductor chip 16 contact each other, the both edge faces applies a force to each other and may be broken by a crack. In order to suppress the damage, the D2 is, for example, 10 μm or more and 20 μm or less. A distance D3 from the edge of the pad 16a to the edge face of the semiconductor chip 16 is, for example, 100±50 μm.

One edge of the bonding wire 30 is coupled to a center portion of the pad 16a. The other edge of the bonding wire 30 is coupled to a center portion of the pad 12c. A maximum length of the bonding wire 30 is calculated as follows.

(A distance ($L1/2+D1$) from a center of the pad 12c to the edge face of the interposer 12)+(an absolute value (50 μm) of a tolerance of $D1$)+(the distance D2)+(a distance (D3+L2/2) from the edge face of the semiconductor chip 16 to the center of the pad 16a)+(an absolute value (50 μm) of a tolerance of D3)

A maximum of the length of the bonding wire 30 is, for example, 345 μm and is 500 μm or less.

[Manufacturing Method of the Semiconductor Device]

FIG. 3A, FIG. 4A, FIG. 5A, FIG. 6A and FIG. 7A illustrate a cross sectional view describing the manufacturing method of the semiconductor device 100. FIG. 3B, FIG. 4B, FIG. 5B, FIG. 6B and FIG. 7B illustrate a plane view describing the manufacturing method of the semiconductor device 100.

Figure 3A:
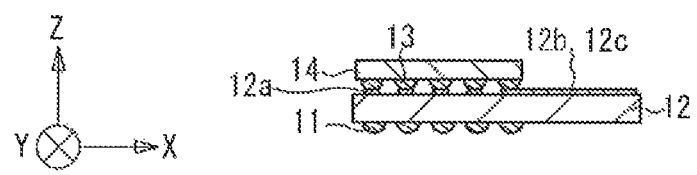
FIG. 3A illustrates a cross sectional view describing a manufacturing method of a semiconductor device.
Figure 3B:
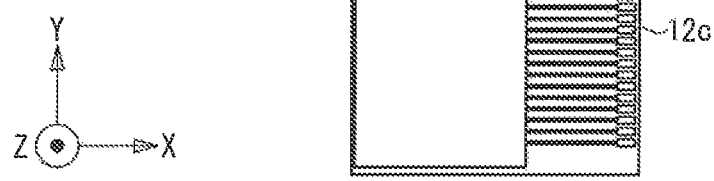
FIG. 3B illustrates a plane view describing a manufacturing method of a semiconductor device.
Figure 4A:
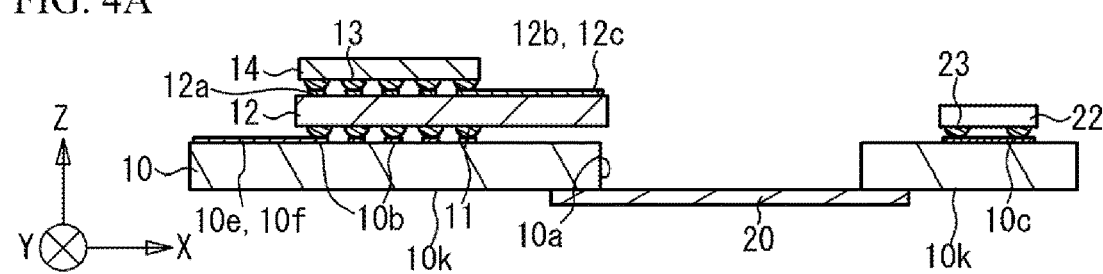
FIG. 4A illustrates a cross sectional view describing a manufacturing method of a semiconductor device.
Figure 4B:
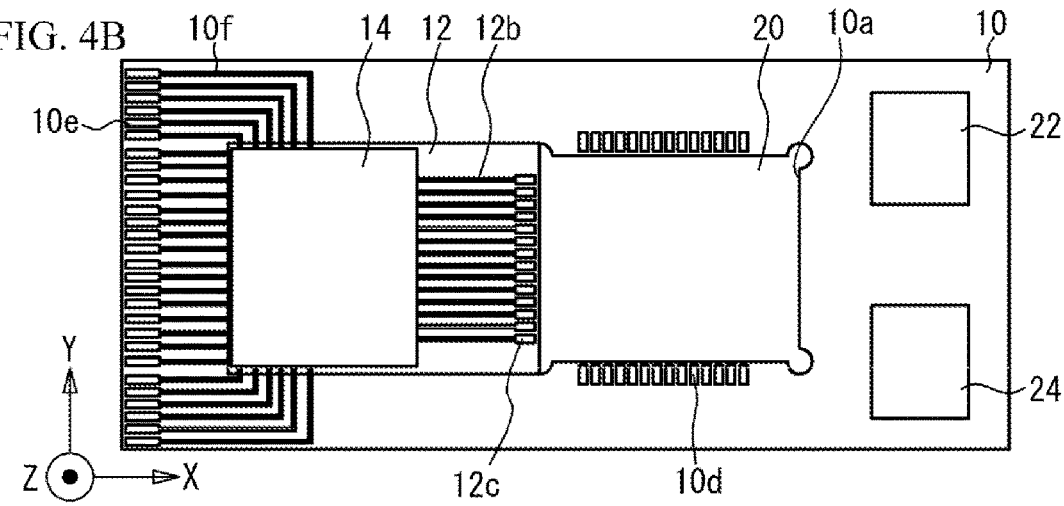
FIG. 4B illustrates a plane view describing a manufacturing method of a semiconductor device.

As illustrated in FIG. 3A and FIG. 3B, the semiconductor component 14 is surface-mounted on the upper face of the interposer 12 with use of the solder ball 13 or the like. As illustrated in FIG. 4A and FIG. 4B, the through hole 10a is formed in the printed substrate 10 by a punching process. The metal board 20 is fixed to a position of the lower face 10k of the printed substrate 10 overlapping with the through hole 10a in the extension direction of the through hole 10a, through epoxy adhesive agent or the like. That is, the metal board 20 is inside of the through hole 10a in a plane view. The metal board 20 is smaller than the through hole 10a in the plane view. Moreover, the interposer 12 and the semiconductor components 22 and 24 are surface-mounted on the printed substrate 10 with use of a solder ball 23 or the like.

Figure 5A:
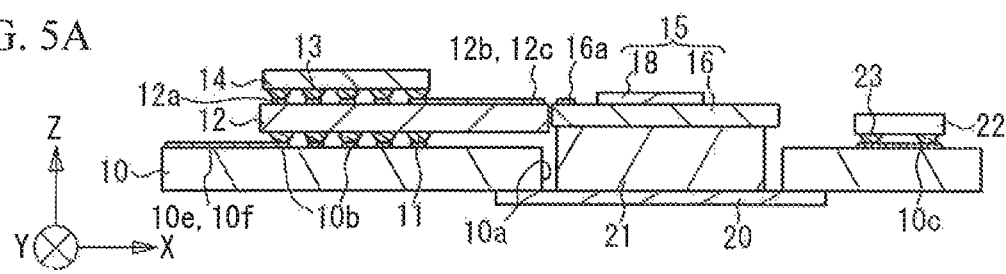
FIG. 5A illustrates a cross sectional view describing a manufacturing method of a semiconductor device.
Figure 5B:
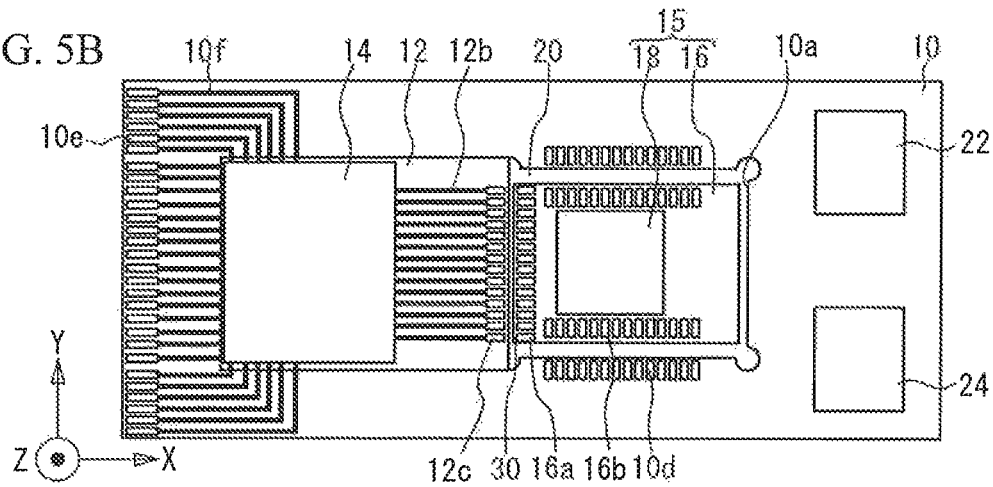
FIG. 5B illustrates a plane view describing a manufacturing method of a semiconductor device.

As illustrated in FIG. 5A and FIG. 5B, the base member 21 is bonded to the upper face of the metal board 20. And the semiconductor chip 16 is bonded to the upper face of the base member 21. The semiconductor chip 18 is flip-chip mounted on the upper face of the semiconductor chip 16. The semiconductor chip 18 is flip-chip mounted on the upper face of the semiconductor chip 16 through a connection structure such as a copper pillar between chips. It is preferable that the semiconductor chip 18 is mounted before mounting the semiconductor chip 16 on the base member 21.

Figure 6A:
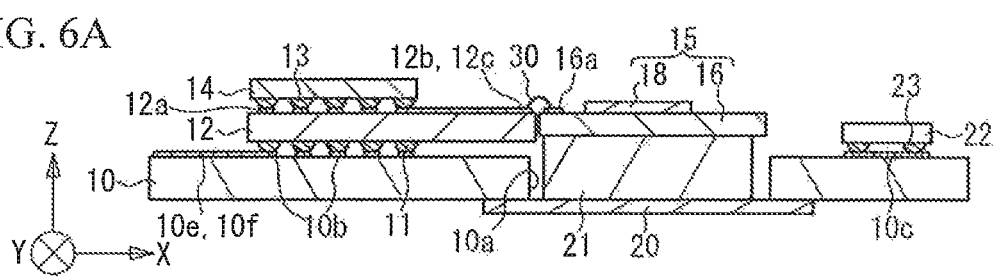
FIG. 6A illustrates a cross sectional view describing a manufacturing method of a semiconductor device.
Figure 6B:
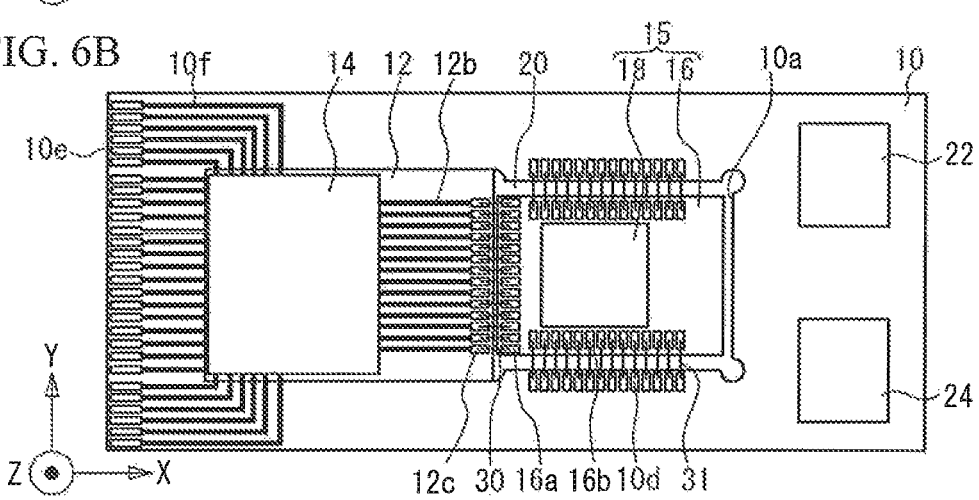
FIG. 6B illustrates a plane view describing a manufacturing method of a semiconductor device.
Figure 7A:
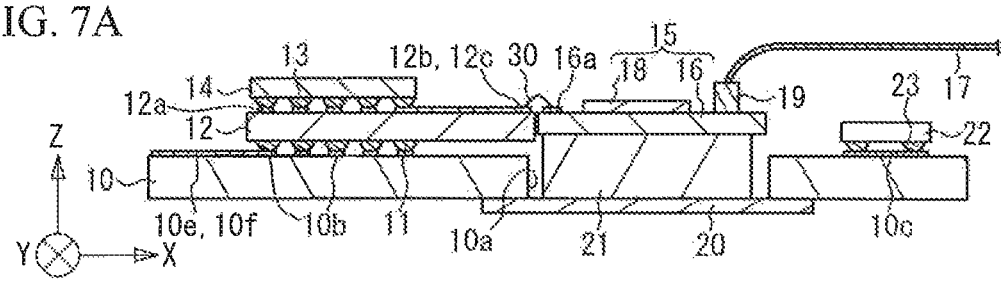
FIG. 7A illustrates a cross sectional view describing a manufacturing method of a semiconductor device.
Figure 7B:
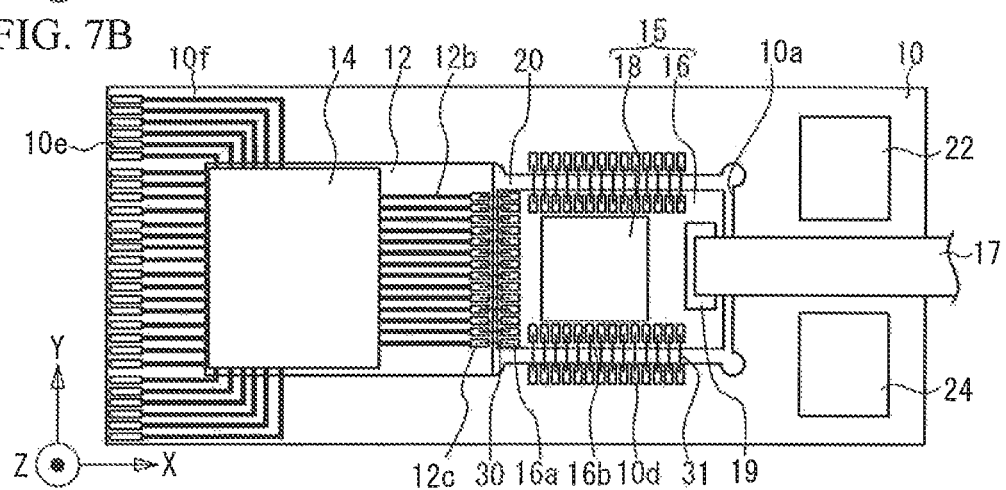
FIG. 7B illustrates a plane view describing a manufacturing method of a semiconductor device.

As illustrated in FIG. 6A and FIG. 6B, the wire bonding is performed. The bonding wire 30 electrically couples the pad 12c to the pad 16a. The bonding wire 31 electrically couples the pad 16b to the pad 10d. For example, a wedge bonder is used as the wire bonding. As illustrated in FIG. 7A and FIG. 7B, the optical fiber 17 is coupled to the semiconductor chip 16. With the processes, the semiconductor device 100 is manufactured.

First Comparative Embodiment

Figure 8A:
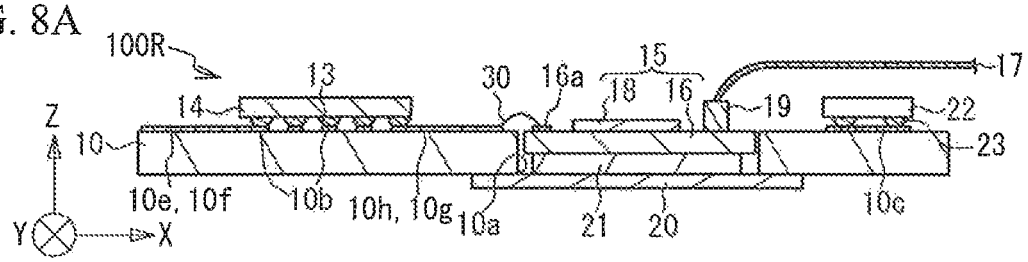
FIG. 8A illustrates a cross sectional view of a semiconductor device in accordance with a first comparative embodiment.
Figure 8B:
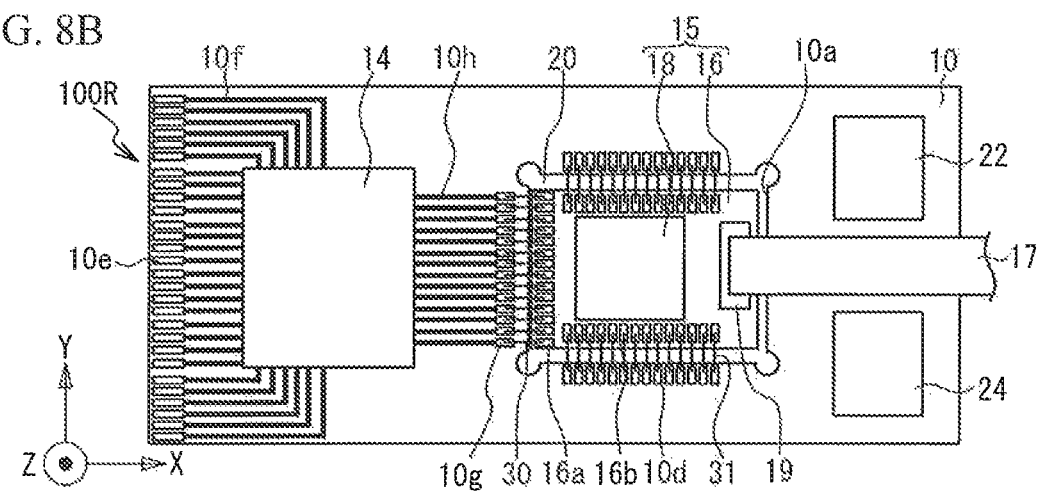
FIG. 8B illustrates a plane view of a semiconductor device.

Next, a description will be given of a first comparative embodiment. FIG. 8A illustrates a cross sectional view of a semiconductor device 100R in accordance with the first comparative embodiment. FIG. 8B illustrates a plane view of the semiconductor device 100R. An explanation of the same structure as the first embodiment is omitted.

As illustrated in FIG. 8A and FIG. 8B, the semiconductor device 100R does not include the interposer 12. The semiconductor component 14 is surface-mounted on the upper face of the printed substrate 10. The base member 21 is thinner than that of the first embodiment. The semiconductor chip 16 and the base member 21 are inside of the through hole 10a. The upper face of the semiconductor chip 16 is positioned at the same height as the upper face of the printed substrate 10. The edge face of the semiconductor chip 16 faces with a wall face of the through hole 10a. The pad 16a of the upper face of the semiconductor chip 16 is coupled to a pad 10g of the upper face of the printed substrate 10 via the bonding wire 30. An electrical signal is input and output between the semiconductor component 14 and the semiconductor chip 16 via a wiring pattern 10h, the pad 10g, the pad 16a and the bonding wire 30.

For example, when the printed substrate 10 is subjected to a punching process, the through hole 10a is formed. In the punching process, a grinding undercut of an object is considered. Therefore, the processing accuracy of the punching process is lower than that of the dicing process. A distance from the edge of the pad 10g to the wall face of the through hole 10a is, for example, 200±200 μm. The tolerance of the distance is larger than the tolerance of the distance D2. In order to suppress the crack in the semiconductor chip 16 caused by the thermal expansion, the printed substrate 10 does not contact the semiconductor chip 16. For example, the distance between the printed substrate 10 and the semiconductor chip 16 is approximately 20 μm. In this case, when the tolerance of ±200 μm of the distance between the edge of the pad 10g to the wall face of the through hole 10a is considered, the maximum distance between the pad 10g and the pad 16a is larger than that of the first embodiment. Therefore, the bonding wire 30 may be long. For example, the maximum length of the bonding wire 30 may be 645 μm. When the bonding wire 30 is long, the inductance increases and a waveform of an electrical signal is degraded. The bonding wire 30 conducts a high rate electrical signal of 25 Gbaud to 50 Gbaud. Therefore, the waveform of the electrical signal is greatly degraded because of the increased inductance.

In the first embodiment, the distance D1 from the edge of the pad 12c of the interposer 12 to the edge face of the interposer 12 is 50±50 μm. The interposer 12 is next to the semiconductor chip 16. The edge face of the interposer 12 protrudes toward the semiconductor chip 16 side with respect to the wall face of the through hole 10a. The edge face of the interposer 12 faces with the edge face of the semiconductor chip 16. Therefore, the distance D2 between the interposer 12 and the semiconductor chip 16 is smaller than that of the first comparative embodiment. The bonding wire 30 becomes shorter.

The printed substrate 10 is made of resin. The interposer 12 is made of ceramic. Therefore, the processing accuracy of an outline shape of the interposer 12 is higher than the processing accuracy of forming the through hole 10a in the printed substrate 10. For example, the tolerance of the distance D1 between the edge face of the interposer 12 and the pad 12c is ±50 μm. The interposer 12 of which the processing accuracy is high is next to the semiconductor chip 16. It is therefore possible to reduce the distance D2. And, the distance between the pad 12c of the interposer 12 and the pad 16a on the upper face of the semiconductor chip 16 becomes smaller. The bonding wire 30 becomes shorter. And, the degradation of the waveform of the electrical signal is suppressed.

When a laminated substrate in which a plurality of glass epoxy resin layers (insulating layers) are adhered to each other through a prepreg is subjected to the dicing process, a glass fiber becomes sagging or burr. In order to suppress the sagging and the burr and reduce a surface roughness of the edge face of the interposer 12, it is preferable that the interposer 12 is made of ceramic and is formed by the dicing process.

When the rate of the electrical signal is high, a loss of a signal in a high frequency band caused by a dielectric loss of a substrate material increases. In order to suppress the loss of the signal in the high frequency band caused by the dielectric loss of the substrate, it is preferable that the interposer for conducting a high rate signal is made of ceramic that is a material of a low dielectric loss. The material of the low dielectric loss such as the ceramic is expensive. Therefore, when the whole of the printed substrate is made of ceramic, a cost greatly increases. And so, the printed substrate 10 is made of a low cost material such as glass epoxy resin. And the interposer 12 for conducting an electrical signal of the highest frequency is made of a high cost material such as ceramic. When the interposer 12 smaller than the printed substrate 10 is made of ceramic, it is possible to suppress the cost and the loss of the signal in the high frequency band.

The interposer 12 may be a thin laminated substrate of a buildup structure made of grass epoxy resin. When the printed substrate 10 and the interposer 12 are laminated substrates of the glass epoxy resin, the interposer 12 has a structure in which thin layers are laminated with a buildup structure. And the printed substrate 10 has a structure in which a plurality of glass epoxy resin layers (insulating layers) are bonded to each other through a prepreg and has a thick laminated structure. When a thin layer is used, the processing accuracy of the interposer 12 is high. And it is possible to reduce the tolerance of the distance D1 illustrated in FIG. 2. However, it is preferable that the interposer 12 is made of ceramic in order to improve the processing accuracy and reduce the loss of the signal in the high frequency band caused by the dielectric loss of the substrate material.

The interposer 12 is formed by the dicing process. In the dicing process, an object is grinded. Therefore, it is not necessary to consider the grinding undercut of the object. Therefore, the accuracy of the dicing process is high. The tolerance of the distance D2 can be reduced, and the bonding wire 30 can be shortened. A method other than the dicing process may be used in the formation of the interposer 12. However, it is preferable that the dicing process is used in order to enlarge the processing accuracy. The through hole 10a of the printed substrate 10 may be formed by another drilling process such as a router process other than the punching process.

The rate of the electrical signal transmitted in the bonding wire 30 is higher than that of an electrical signal transmitted between the semiconductor component 14 and the printed substrate 10. The high rate of an electrical signal is a high modulation baud rate. An inductance of the bonding wire 30 influences on an electrical signal with a high rate more than an electrical signal with a low rate. In the first embodiment, the bonding wire 30 is small. It is therefore possible to suppress the degradation of the electrical signal caused by the inductance of the bonding wire 30.

The semiconductor component 14 converts an electrical signal input from the printed substrate 10 into an electrical signal with a high rate. And, the semiconductor component 14 converts an electrical signal input from the interposer 12 into an electrical signal with a low rate. The semiconductor component 14 performs at least one of the conversion to a high rate and the conversion to a low rate. An electrical signal with a high rate is transmitted in the bonding wire 30. In the first embodiment, the bonding wire 30 is short. It is therefore possible to suppress the degradation of the electrical signal waveform caused by the inductance of the bonding wire 30.

The modulation rate of the electrical signal transmitted in the bonding wire 30 is, for example, 25 Gbaud or more, 50 Gbaud or more, or 64 Gbaud or more. The length of the bonding wire 30 may be determined in accordance with a modulation rate so that the degradation of the electrical signal is suppressed. When the modulation rate is 50 Gbaud, it is preferable that the length of the bonding wire 30 is 500 µm or less. When the modulation rate is 25 Gbaud, it is preferable that the length of the bonding wire 30 is 1000 µm or less. The length of the bonding wire 30 may be 400 µm or less, or 300 µm or less.

The upper face of the interposer 12 is positioned at the same height as that of the upper face of the semiconductor chip 16. In this case, the pad 12c is approximately positioned at the same height as that of the pad 16a. It is therefore possible to shorten the bonding wire 30 in which an electrical signal with a high rate is transmitted, compared to a case where there is a height difference between the pad 12c and the pad 16a.

The semiconductor component 14 is surface-mounted on the interposer 12. The interposer 12 is surface-mounted on the upper face of the printed substrate 10. Thus, the printed substrate 10, the semiconductor component 14 and the interposer 12 are electrically coupled to each other.

The metallic base member 21 is provided inside of the through hole 10a. The semiconductor chip 16 is provided on the upper face of the base member 21. It is possible to adjust the height of the upper face of the semiconductor chip 16, by the thickness of the base member 21. For example, the height of the base member 21 is determined so that the position of the upper face of the semiconductor chip 16 is the same as that of the upper face of the interposer 12. The base member 21 has high thermal conductivity because the base member 21 is made of a metal such as Cu. It is therefore possible to effectively release the heat of the semiconductor element 15.

The semiconductor element 15 converts an electrical signal into an optical signal and outputs the optical signal in the optical fiber 17. Alternatively or in addition, the semiconductor element 15 converts an optical signal input from the optical fiber 17 into an electrical signal. The optical fiber 17 is coupled to the upper face of the semiconductor chip 16 structuring the semiconductor element 15. The optical fiber 17 extends toward an upper side and horizontally extends from the upper face of the semiconductor chip 16. It is therefore not necessary to extract the optical fiber 17 from an inner side of the through hole 10a to an outer side. It is possible to suppress the contact between the printed substrate 10 and the optical fiber 17. The possibility of the contact between the printed substrate 10 and the optical fiber 17 is low. It is therefore possible to reduce the distance between the wall face of the through hole 10a and the semiconductor chip 16. That is, it is possible to downsize the through hole 10a, and downsize the printed substrate 10.

The distance D2 between the interposer 12 and the semiconductor chip 16 illustrated in FIG. 3A and FIG. 3B may be 0 to 20 µm. That is, the edge face of the interposer 12 may contact the edge face of the semiconductor chip 16 or may be spaced from the edge face of the semiconductor chip 16. However, due to a temperature of a usage environment, there is a horizontal stress between the interposer 12 and the semiconductor chip 16 because of thermal expansion, and a crack may occur because of the stress. In this case, in order to suppress the occurrence of the stress, the edge face of the interposer 12 is spaced from the edge face of the semiconductor chip 16, and the distance D2 is 10 µm or more and 20 µm or less.

Modified Embodiment

Figure 9A:
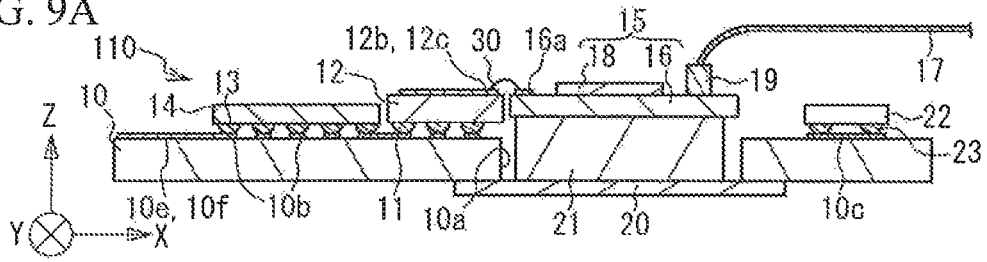
FIG. 9A illustrates a cross sectional view of a semiconductor device in accordance with a modified embodiment of a first comparative embodiment.
Figure 9B:
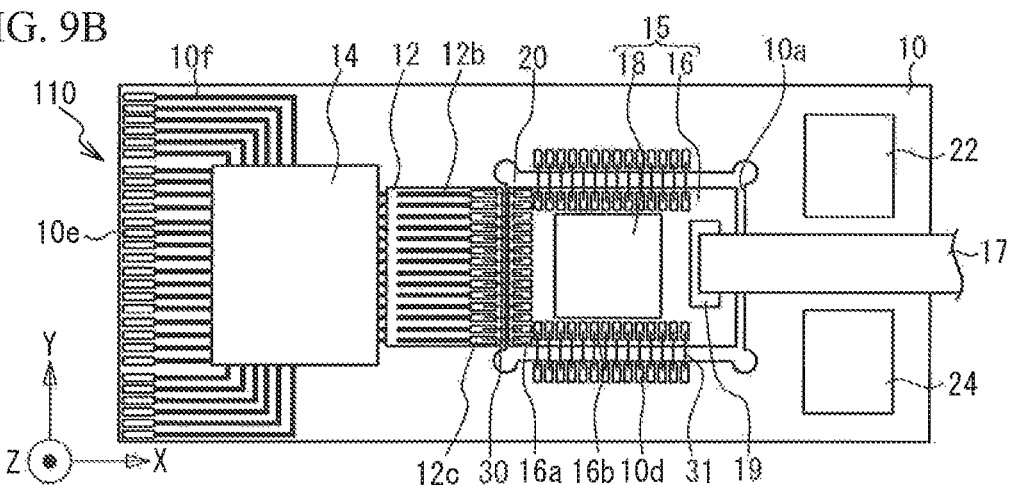
FIG. 9B illustrates a plane view of a semiconductor device.

FIG. 9A illustrates a cross sectional view of a semiconductor device 110 in accordance with a modified embodiment of the first embodiment. FIG. 9B illustrates a plane view of the semiconductor device 110. An explanation of the same structure as the first embodiment is omitted.

As illustrated in FIG. 9A and FIG. 9B, the interposer 12 and the semiconductor component 14 are surface-mounted on the upper face of the printed substrate 10. Thus, the printed substrate 10, the semiconductor component 14 and the interposer 12 are electrically coupled to each other. The other structures are the same as the first embodiment. In the modified embodiment, the bonding wire 30 becomes shorter. It is therefore possible to suppress the degradation of an electrical signal caused by the inductance of the bonding wire 30.

Second Embodiment

Figure 10A:
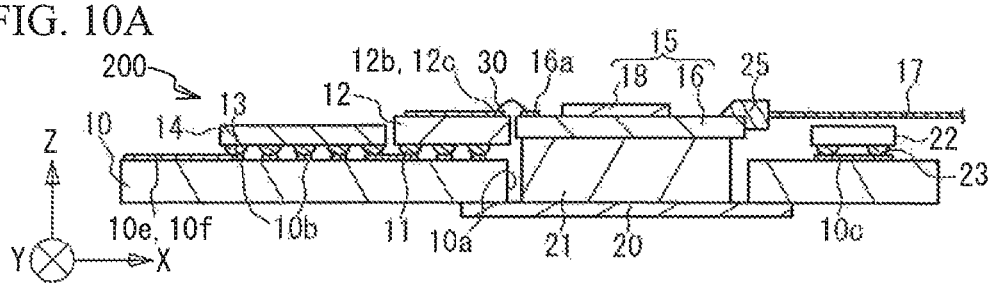
FIG. 10A illustrates a cross sectional view of a semiconductor device in accordance with a second comparative embodiment.
Figure 10B:
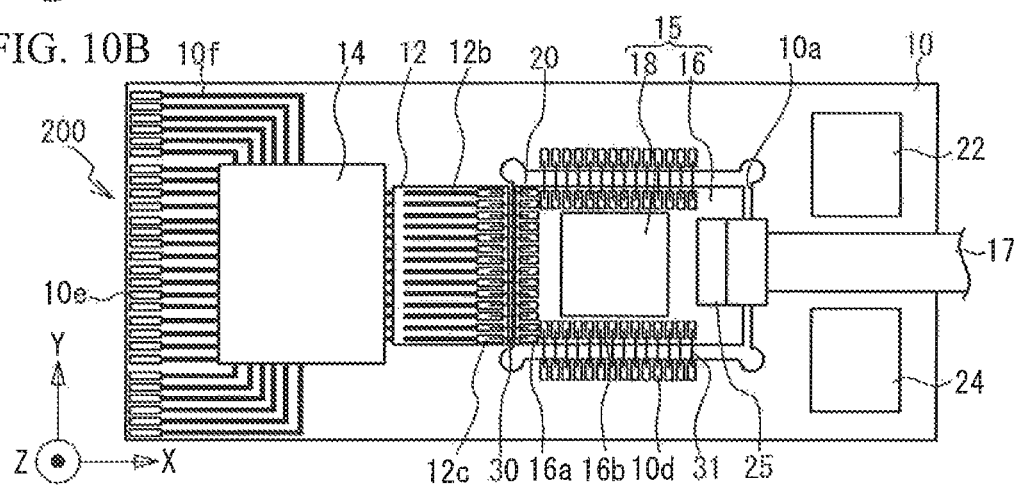
FIG. 10B illustrates a plane view of a semiconductor device.

FIG. 10A illustrates a cross sectional view of a semiconductor device 200 in accordance with a second embodiment. FIG. 10B illustrates a plane view of the semiconductor device 200. An explanation of the same structure as the first embodiment is omitted.

As illustrated in FIG. 10A and FIG. 10B, a holder 25 is connected to from the upper face to the side face of the semiconductor chip 16. The optical fiber 17 is coupled to the semiconductor chip 16 with use of the holder 25.

Figure 11A:
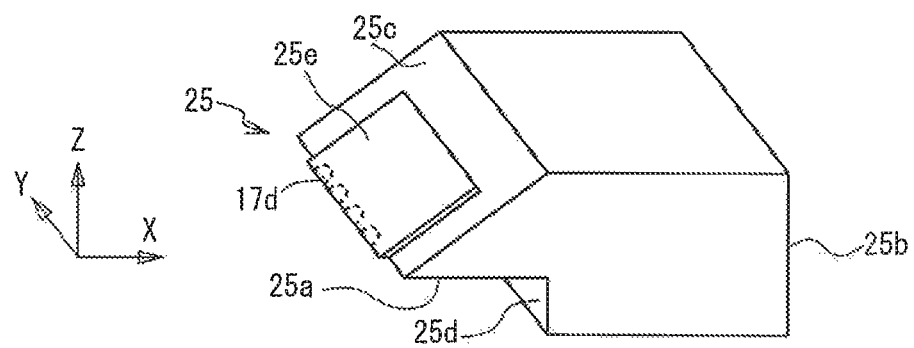
FIG. 11A and FIG. 11B illustrate an enlarged view of a holder.
Figure 11B:
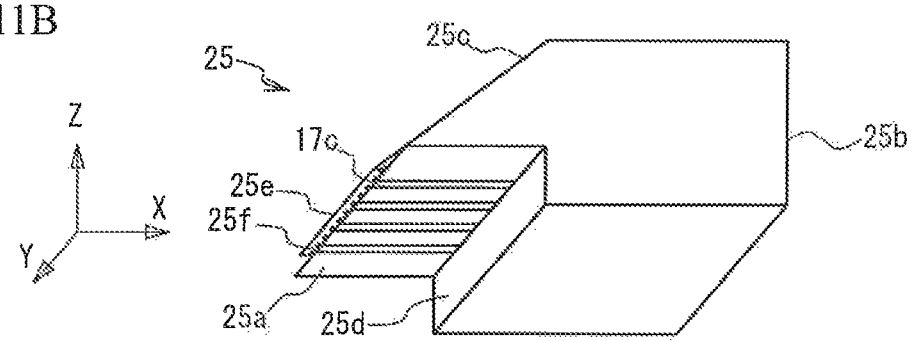
Figure 11C:
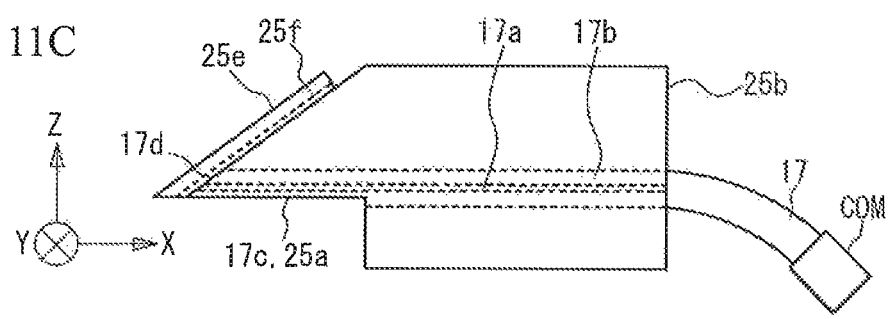
FIG. 11C illustrates a side view of a holder.

FIG. 11A and FIG. 11B illustrate an enlarged view of the holder 25. FIG. 11C illustrates a side view of the holder 25. A face 25a of the holder 25 illustrated in FIG. 11A and FIG. 11B extends in the XY plane and is arranged on the upper face of the semiconductor chip 16. A face 25c is a processed into an inclined face. The holder 25 is obliquely cut with respect to the extension direction of the optical fiber 17, in the face 25c. The optical fiber 17 is obliquely cut with respect to the extension direction of the optical fiber 17, in a face 17d. A reflection board 25e on the face 25c of the holder 25 reflects a light emitted from the optical fiber 17, in a face 25f facing with the face 25c. Alternatively the reflection board 25e inputs the reflected light in the optical fiber 17. A film such as a dielectric multilayer film or a metal film appropriate for a reflection of a light is formed on the face 25f. The face 25f is bonded with the face 17d and the face 25c by a resin of which a refraction index is approximately the same as that of the optical fiber. The semiconductor chip 16 is optically coupled to the optical fiber 17 via a light reflection at the face 25f.

The optical fiber 17 has a core portion 17a and a clad portion 17b. In a part of the holder 25, a part of the clad portion 17b of the optical fiber is cut out and makes a plane 17c. The plane 17c is on the same plane as the face 25a of the holder 25. A light reflected by the face 25f enters the semiconductor chip 16 from the optical fiber 17 via the plane 17c. Alternatively, a light emitted from the semiconductor chip 16 enters the optical fiber 17 via the plane 17c. A distance between the core portion 17a and the plane 17c of the optical fiber is set to be 10 μm to 20 μm. A face 25d is a face extending in the YZ plane. The face 25d is terminated at the face 25a and the plane 17c. A height of the face 25d is, for example, 0.5 to 1 mm. The optical fiber 17 is inserted in the holder 25 from a face 25b and extends to the horizontal direction in the holder 25 as illustrated in FIG. 11C. That is, the optical fiber 17 extends to the horizontal direction from the semiconductor chip 16. The other edge of the optical fiber 17 is connected to an optical connector COM and is terminated. The other structures are the same as the first embodiment. Next, a description will be given of a second comparative embodiment and a third comparative embodiment.

Second Comparative Embodiment

Figure 12A:
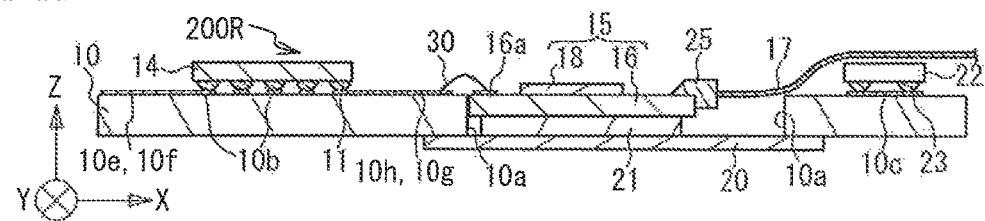
FIG. 12A illustrates a cross sectional view of a semiconductor device in accordance with a second comparative embodiment.
Figure 12B:
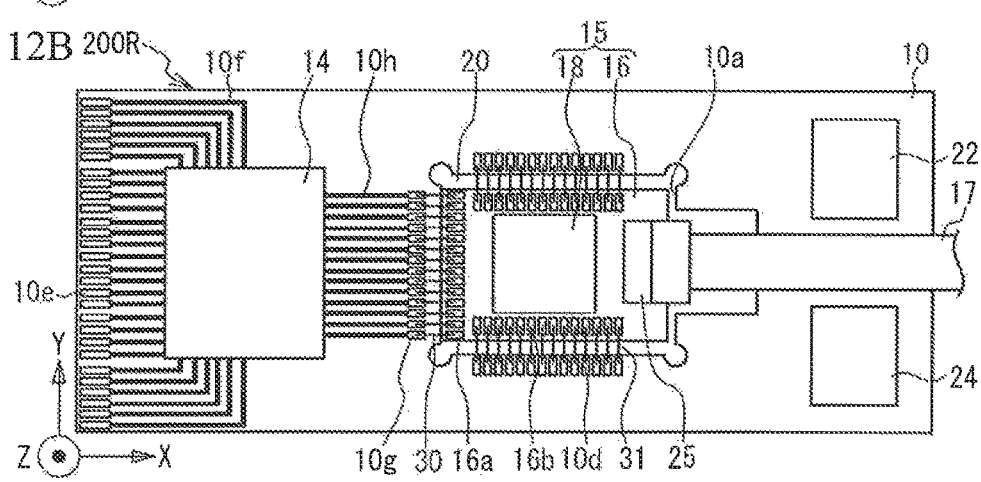
FIG. 12B illustrates a plane view of a semiconductor device.

FIG. 12A illustrates a cross sectional view of a semiconductor device 200R in accordance with a second comparative embodiment. FIG. 12B illustrates a plane view of the semiconductor device 200R. An explanation of the same structure as the first embodiment and the second embodiment is omitted.

As illustrated in FIG. 12A, the interposer 12 is not provided. The semiconductor component 14 is surface-mounted on the upper face of the printed substrate 10. Compared to the second embodiment, the base member is thinner, and the semiconductor chip 16 and the base member 21 are positioned inside of the through hole 10a. The upper face of the semiconductor chip 16 is positioned at the same height as that of the upper face of the printed substrate 10. The edge face of the semiconductor chip 16 faces with the wall face of the through hole 10a. The pad 16a on the upper face of the semiconductor chip 16 is bonded with the pad 10g on the upper face of the printed substrate 10 via the bonding wire 30.

The semiconductor chip 16 is positioned inside of the through hole 10a. A part of the holder 25 is at a lower position than the upper face of the printed substrate 10. Therefore, the optical fiber 17 is extracted from the inner side of the through hole 10a to the outer side. In order to suppress the contact between the optical fiber 17 and the printed substrate 10, the through hole 10a is enlarged, and the distance between the wall face at the +X side and the semiconductor chip 16 is enlarged. Therefore, the printed substrate 10 is enlarged.

Third Comparative Embodiment

Figure 13A:
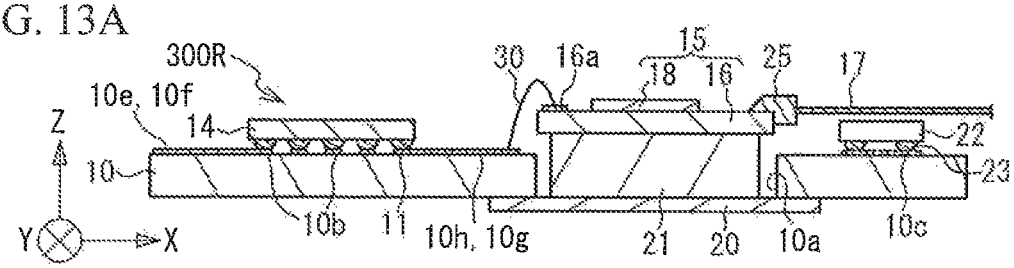
FIG. 13A illustrates a cross sectional view of a semiconductor device in accordance with a third comparative embodiment.
Figure 13B:
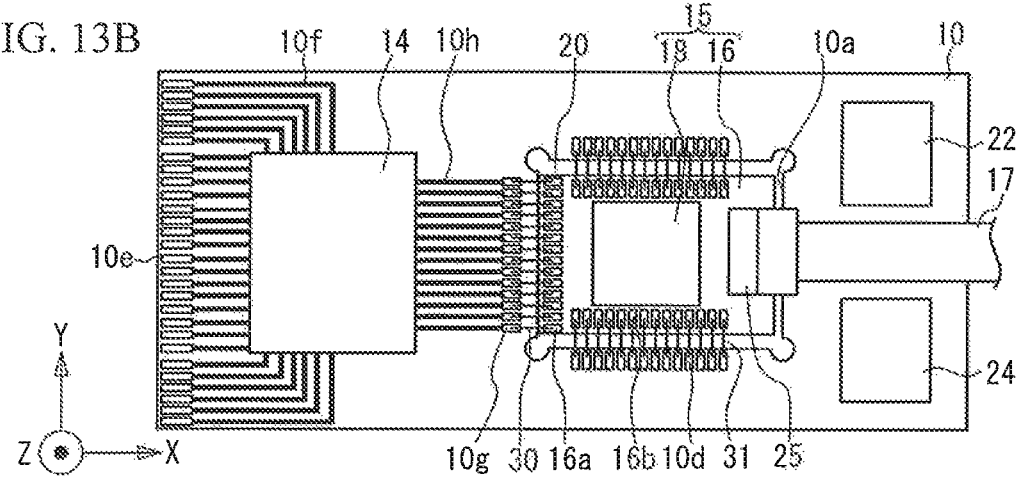
FIG. 13B illustrates a plane view of a semiconductor device.

FIG. 13A illustrates a cross sectional view of a semiconductor device 300R in accordance with a third comparative embodiment. FIG. 13B illustrates a plane view of the semiconductor device 300R. An explanation of the same structure as the second comparative embodiment is omitted.

Compared to the second comparative embodiment, the base member 21 is thicker in the third comparative embodiment. Therefore, the upper face of the semiconductor chip 16 is positioned at a higher position than the upper face of the printed substrate 10. Thus, the contact between the optical fiber 17 and the printed substrate 10 is suppressed. It is therefore possible to downsize the through hole 10a. However, the bonding wire 30 couples the pad 16a at a higher position to the pad 10g at a lower position. Therefore, the bonding wire 30 becomes longer. When the bonding wire 30 is long, the inductance increases and a waveform of an electrical signal may be degraded. Specifically, the bonding wire 30 conducts an electrical signal with a high rate of 25 Gbaud to 50 Gbaud. Therefore, the electrical signal is greatly degraded because of the length of the wire.

On the other hand, in the second embodiment, the bonding wire 30 is shortened. It is therefore possible to suppress the waveform degradation of an electrical signal caused by the inductance of the bonding wire 30. Specifically, the upper face of the semiconductor chip 16 is positioned at the same height as the upper face of the interposer 12. In this case, the bonding wire 30 becomes shorter. The upper face of the semiconductor chip 16 is positioned at a higher position than the upper face of the printed substrate 10. And the optical fiber 17 extends to a horizontal direction. It is therefore possible to effectively suppress the contact between the printed substrate 10 and the optical fiber 17. The possibility of the contact between the printed substrate 10 and the optical fiber 17 is small. It is therefore possible to reduce the distance between the wall face of the through hole 10a and the semiconductor chip 16. That is, the through hole 10a can be downsized, and the printed substrate 10 can be downsized.

Modified Embodiment

Figure 14A:
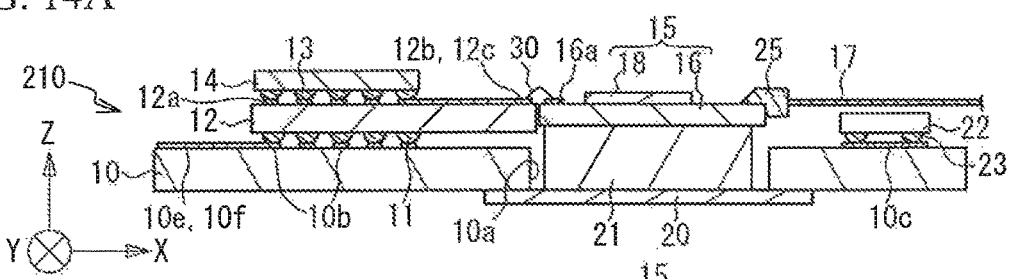
FIG. 14A illustrates a cross sectional view of a semiconductor device in accordance with a modified embodiment of a second embodiment.
Figure 14B:
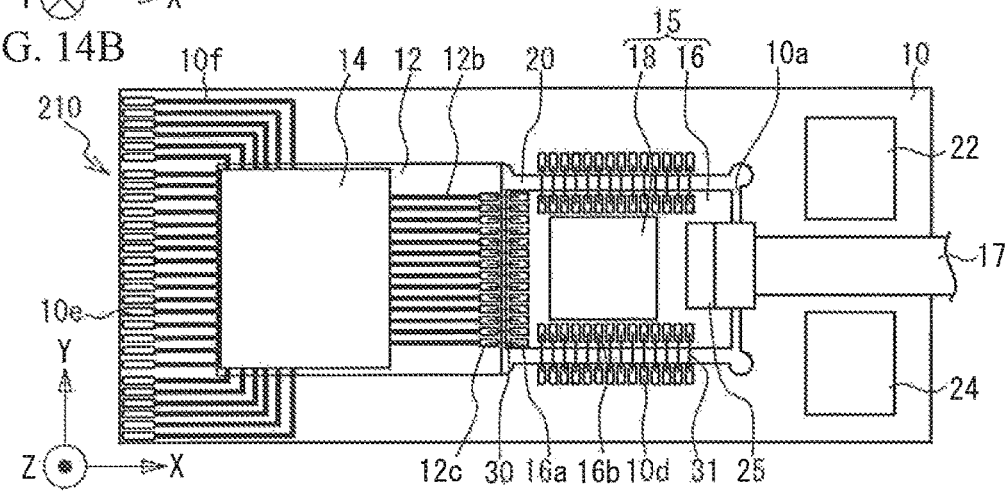
FIG. 14B illustrates a plane view of a semiconductor device.

FIG. 14A illustrates a cross sectional view of a semiconductor device 210 in accordance with a modified embodiment of the second embodiment. FIG. 14B illustrates a plane view of the semiconductor device 210. An explanation of the same structure as the second embodiment is omitted. As illustrated in FIG. 14A and FIG. 14B, the semiconductor component 14 is surface-mounted on the printed substrate 10, and the interposer 12 is surface-mounted on the upper face of the printed substrate 10. Other structures are the same as the second embodiment. In the modified embodiment, it is possible to shorten the bonding wire 30 as well as the second embodiment.

What is claimed is:

1. A semiconductor device comprising:
   a printed substrate in which a through hole is formed from an upper face thereof to a lower face thereof;
   a first semiconductor element that is mounted on the printed substrate and is electrically coupled to the printed substrate;
   an interposer that is mounted on the upper face of the printed substrate and is electrically coupled to the first semiconductor element;
   a second semiconductor element that is adjacent to the interposer and is arranged so as to overlap with the through hole; and
   a bonding wire that couples a first pad to a second pad, the first pad being on an upper face of the interposer and being positioned on the second semiconductor element side, the second pad being on an upper face of the second semiconductor element and being positioned on the interposer side,
   wherein the interposer has an edge face protruding with respect to a wall face of the through hole of the printed substrate toward the second semiconductor element, and the edge face faces with an edge face of the second semiconductor element.

2. The semiconductor device as claimed in claim 1, wherein:
   the printed substrate is made of resin; and
   the interposer is made of ceramic.

3. The semiconductor device as claimed in claim 1, wherein a rate of an electrical signal transmitted in the bonding wire is higher than that of an electrical signal transmitted between the first semiconductor element and the printed substrate.

4. The semiconductor device as claimed in claim 1, wherein the first semiconductor element performs at least one of increasing a rate of an electrical signal input from the printed substrate and decreasing a rate of an electrical signal input from the interposer.

5. The semiconductor device as claimed in claim 1, wherein an upper face of the first pad of the interposer is positioned at a same height as an upper face of the second pad of the second semiconductor element.

6. The semiconductor device as claimed in claim 1, wherein the interposer and the first semiconductor element are surface-mounted on the upper face of the printed substrate.

7. The semiconductor device as claimed in claim 1, wherein:
   the interposer is surface-mounted on the upper face of the printed substrate; and
   the first semiconductor element is surface-mounted on the upper face of the interposer.

8. The semiconductor device as claimed in claim 1, further comprising a metallic base member that is provided inside of the through hole,
   wherein the second semiconductor element is provided on an upper face of the base member.

9. The semiconductor device as claimed in claim 1, further comprising an optical fiber that extends from the upper face of the second semiconductor element or a side face of the second semiconductor element,
   wherein the second semiconductor element performs at least one of converting an electrical signal input from the interposer into an optical signal and outputting the optical signal to the optical fiber, and converting an optical signal input from the optical fiber into an electrical signal.

10. A manufacturing method of a semiconductor device that comprises a printed substrate in which a through hole is formed from an upper face thereof to a lower face thereof; a first semiconductor element that is mounted on the printed substrate and is electrically coupled to the printed substrate; an interposer that is mounted on the upper face of the printed substrate and is electrically coupled to the first semiconductor element; a second semiconductor element that is adjacent to the interposer and is arranged so as to overlap with the through hole; and a bonding wire that couples a first pad to a second pad, the first pad being on an upper face of the interposer and being positioned on the second semiconductor element side, the second pad being on an upper face of the second semiconductor element and being positioned on the interposer side, the method comprising:
   preparing in the printed substrate, the through hole from the upper face to the lower face of the substrate;
   mounting the first semiconductor element on the upper face of the interposer so that the first semiconductor element is electrically coupled to the interposer;
   mounting the interposer on the upper face of the printed substrate so that the interposer is electrically coupled to the printed substrate and the edge face of the interposer protrudes with respect to the wall face of the through hole;
   arranging the second semiconductor element so that the second semiconductor element is adjacent to the interposer and overlaps with the through hole and that the edge face of the second semiconductor element faces the edge face of the interposer; and
   electrically coupling the first pad that is on an the upper face of the interposer and positioned on the second semiconductor element side to the second pad that is on the upper face of the second semiconductor element and positioned on the interposer side by the bonding wire.

* * * * *